(12) United States Patent
Hirano et al.

(10) Patent No.: US 11,165,002 B2
(45) Date of Patent: Nov. 2, 2021

(54) LIGHT-EMITTING DEVICE

(71) Applicants: Soko Kagaku Co., Ltd., Ishikawa (JP); AGC INC., Tokyo (JP)

(72) Inventors: Akira Hirano, Aichi (JP); Yosuke Nagasawa, Nara (JP); Masamichi Ippommatsu, Hyogo (JP); Ko Aosaki, Tokyo (JP); Yuki Suehara, Tokyo (JP); Yoshihiko Sakane, Tokyo (JP)

(73) Assignees: SOKO KAGAU CO., LTD., Ishikawa (JP); AGC INC., Tokyo (JP)

( * ) Notice: Subject to any disclaimer, the term of this patent is extended or adjusted under 35 U.S.C. 154(b) by 32 days.

(21) Appl. No.: 16/630,743

(22) PCT Filed: Aug. 30, 2017

(86) PCT No.: PCT/JP2017/031199
§ 371 (c)(1),
(2) Date: Jan. 13, 2020

(87) PCT Pub. No.: WO2019/043840
PCT Pub. Date: Mar. 7, 2019

(65) Prior Publication Data
US 2020/0168775 A1 May 28, 2020

(51) Int. Cl.
*H01L 33/56* (2010.01)
*H01L 33/54* (2010.01)
*H01L 33/58* (2010.01)
*H01L 33/62* (2010.01)

(52) U.S. Cl.
CPC .............. *H01L 33/56* (2013.01); *H01L 33/54* (2013.01); *H01L 33/58* (2013.01); *H01L 33/62* (2013.01); *H01L 2933/0091* (2013.01)

(58) Field of Classification Search
CPC ......... H01L 33/56; H01L 33/54; H01L 33/58; H01L 33/62; H01L 2933/0091
See application file for complete search history.

(56) References Cited

U.S. PATENT DOCUMENTS

| 2006/0138443 A1 | 6/2006 | Fan et al. |
| 2010/0025707 A1 | 2/2010 | Groetsch |

(Continued)

FOREIGN PATENT DOCUMENTS

| JP | 1-39370 | 5/1989 |
| JP | 04-189880 | 7/1992 |

(Continued)

*Primary Examiner* — Jay C Chang
*Assistant Examiner* — Mikka Liu
(74) *Attorney, Agent, or Firm* — Haynes Beffel & Wolfeld LLP (57) ABSTRACT

A light-emitting device 1 comprises a base 30, a nitride semiconductor light-emitting element 10 flip-chip mounted on the base 30, and an amorphous fluororesin sealing the nitride semiconductor light-emitting element 10. The light-emitting device 1 comprises a deformation-prevention layer 60 for preventing a shape change of an amorphous fluororesin by heat treatment after shipment of the light-emitting device 1, and the deformation-prevention layer 60 is formed of a layer in which a thermosetting resin or an ultraviolet curing resin is cured, and the cured layer directly covers the surface of the amorphous fluororesin.

20 Claims, 8 Drawing Sheets

(56) References Cited

U.S. PATENT DOCUMENTS

| | | | |
|---|---|---|---|
| 2012/0083056 A1* | 4/2012 | Shinbori | H01L 33/54 |
| | | | 438/27 |
| 2015/0243856 A1* | 8/2015 | Yamada | H01L 33/62 |
| | | | 257/99 |
| 2016/0035787 A1 | 2/2016 | Matsuda | |
| 2017/0092817 A1* | 3/2017 | Ikeda | H01L 33/483 |
| 2017/0263817 A1 | 9/2017 | Hirano et al. | |
| 2018/0199433 A1 | 7/2018 | Hirano et al. | |

FOREIGN PATENT DOCUMENTS

| | | |
|---|---|---|
| JP | 11-152310 | 6/1999 |
| JP | H11-227710 A | 8/1999 |
| JP | 2009049177 A | 3/2009 |
| JP | 2009113353 A | 5/2009 |
| JP | 2010505253 A | 2/2010 |
| JP | 2016032049 A | 3/2016 |
| JP | 2017045902 A | 3/2017 |
| JP | 2017120837 A | 7/2017 |
| WO | 2014178288 A1 | 11/2014 |
| WO | 2016157518 | 10/2016 |
| WO | 2017022755 | 9/2017 |

* cited by examiner

LIGHT-EMITTING DEVICE

TECHNICAL FIELD

The present invention relates to a light-emitting device including a nitride semiconductor light-emitting element flip-chip mounted on a base, and more particularly, to a light-emitting device including a nitride semiconductor light-emitting element emitting light having an emission center wavelength of 365 nm or less (ultraviolet light).

BACKGROUND ART

Conventionally, as a nitride semiconductor light-emitting element such as a light emitting diode or a semiconductor laser, a light-emitting element structure including a plurality of nitride semiconductor layers epitaxially grown on a main surface of a substrate such as sapphire has been known. The nitride semiconductor layer is represented by the general formula $Al_{1-x-y}Ga_xIn_yN$ ($0 \le x \le 1$, $0 \le y \le 1$, and $0 \le x+y \le 1$).

As a light-emitting device on which a nitride semiconductor light-emitting element is mounted, a light-emitting device is known in which a nitride semiconductor light-emitting element is flip-chip mounted and light generated in a nitride semiconductor layer is extracted from the rear surface (a surface on the side opposite to the main surface) of a substrate. In addition, among such light-emitting devices, there is a light-emitting device in which a lens is provided on the rear surface side of a substrate in a nitride semiconductor light-emitting element flip-chip mounted (for example, see FIG. 1 of Patent Document 1 below).

PRIOR ART DOCUMENTS

Patent Document

Patent Document 1: WO-A-2014/178288

SUMMARY OF THE INVENTION

Problems to be Solved by the Invention

Patent Document 1 describes that a lens may be formed by sealing a nitride semiconductor light-emitting element with an amorphous fluororesin and molding the surface of the amorphous fluororesin into a spherical surface. However, if a process accompanied by a high-temperature heat treatment is applied to a light-emitting device including a member made of an amorphous fluororesin without being limited to a lens, the amorphous fluororesin is softened by heat, and the shape is changed. For this reason, a user who purchases a light-emitting device including an amorphous fluororesin (hereinafter simply referred to as a "user") cannot apply a process involving high-temperature heat treatment to the light-emitting device, and is subject to a limitation that some alternative method must be selected.

As a specific example of this problem, there is a solder reflow process for mounting the above-mentioned light-emitting device on a desired implementation device, for example, an ultraviolet sterilization device. For example, when a user intends to mount it on a desired implementation device by a solder reflow process using a common solder, e.g., a SnAgCu solder having a melting point of about 220° C., the light-emitting device and the implementation device need to be heated to about 260° C. in order to ensure adequate wettability of the solder and to bond them securely. However, since 260° C. is a temperature at which the amorphous fluororesin can soften to change the shape, such a solder reflow process cannot be applied to a light-emitting device including the amorphous fluororesin. In this case, the user has to select a special mounting method or a special solder that can be bonded securely even at a temperature at which the shape of the amorphous fluororesin does not change.

The present invention has been made in view of the above-mentioned problems, and an object thereof is to provide a light-emitting device capable of performing heat treatment at a temperature at which a shape change of an amorphous fluororesin can occur after shipment.

Means for Solving the Problem

In order to achieve the above object, the present invention provides a light-emitting device comprising a base, a nitride semiconductor light-emitting element flip-chip mounted on the base, and an amorphous fluororesin sealing the nitride semiconductor light-emitting element, wherein the light-emitting device comprises a deformation-prevention layer for preventing a shape change of the amorphous fluororesin by heat treatment after shipment of the light-emitting device, wherein the deformation-prevention layer comprises a layer in which a thermosetting resin or an ultraviolet curing resin is cured, and wherein the cured layer directly covers a surface of the amorphous fluororesin.

According to this light-emitting device, by directly covering the surface of the amorphous fluororesin with the deformation-prevention layer composed of a layer in which a thermosetting resin or an ultraviolet curing resin, which is a resin hardly softened by heat, is cured, it is possible to prevent the shape change of the amorphous fluororesin due to heat treatment after shipment.

In the present invention, the AlGaN based semiconductor is a group III nitride semiconductor based on a ternary (or binary) workpiece represented by the general formula $Al_xGa_{1-x}N$ (x is an AlN molar fraction, $0 \le x \le 1$), whose band gap energy is GaN (x=0) band gap energy (about 3.4 eV) or more, and includes the case where a trace amount of In, P, As, or the like is contained as long as the condition regarding the band gap energy is satisfied.

In the light-emitting device of the above feature, the deformation-prevention layer may cover at least the surface of the optical lens shape that focuses or diffuses the light emitted from the nitride semiconductor light-emitting element, out of the exposed surface of the amorphous fluororesin.

According to this light-emitting device, it is possible to prevent the shape change of the amorphous fluororesin, which is the shape of the optical lens whose optical characteristics are influenced by the shape, and prevent the light emitting performance of the light-emitting device from being greatly impaired.

In the light-emitting device of the above feature, the deformation-prevention layer may be made of a silicone resin or an epoxy resin.

Further, in the light-emitting device having the above feature, the deformation-prevention layer may have gas permeability to helium, argon, oxygen, nitrogen, and water vapor.

According to this light-emitting device, it is possible to prevent the falling of the deformation-prevention layer and the deformation of the amorphous fluororesin due to trapping of gas contained in the atmosphere or in the hermetic package of the light-emitting device between the deformation-prevention layer and the amorphous fluororesin.

In the light-emitting device of the above feature, the structural unit of the polymer or copolymer constituting the amorphous fluororesin may have a fluorine-containing aliphatic cyclic structure. In addition, the terminal functional group of the polymer or copolymer constituting the amorphous fluororesin may be a perfluoroalkyl group. In the light-emitting device of the above feature, the nitride semiconductor light-emitting element may be an ultraviolet light-emitting element having a light emission center wavelength in a range of 200 nm or more and about 365 nm or less.

Further, in the light-emitting device of the above feature, the weight average molecular weight of the polymer or copolymer constituting the amorphous fluororesin may be 700,000 or less.

According to this light-emitting device, when the maximum value of the heat treatment temperature after shipment is assumed to be 260° C., the deformation-prevention layer can prevent the shape change of the amorphous fluororesin that may be caused by the heat treatment after shipment.

Further, in the light-emitting device of the above feature, as a shipment form, the light-emitting device may be enclosed in an airtight package in which the inside is decompressed, in an airtight package in which the inside is filled with helium gas or argon gas, or in an airtight package in which the inside is decompressed and filled with helium gas or argon gas.

According to this light-emitting device, it is possible to prevent oxygen, nitrogen, and water vapor adsorbed by the amorphous fluororesin from expanding and foaming the amorphous fluororesin during heat treatment by the user after shipment.

Effect of the Invention

According to the light-emitting device of the above feature, since the deformation-prevention layer is provided, the shape change of the amorphous fluororesin due to the heat treatment after the shipment can be prevented. Therefore, the light-emitting device of the above-mentioned feature can be subjected to heat treatment at a temperature at which the shape change of the amorphous fluororesin can occur after shipment.

DESCRIPTION OF EMBODIMENT

Hereinafter, a light-emitting device according to an embodiment of the present invention will be described with reference to the drawings. In the drawings referred to in the following description, in order to facilitate understanding of the description, a main part is emphasized in some parts and schematically shown, and therefore, the dimensional ratio of each part is not necessarily the same as that of an actual element and a part used. In the following description, a case where the nitride semiconductor light-emitting element included in the light-emitting device according to the embodiment of the present invention is a light-emitting diode will be described as an example.

<Nitride Semiconductor Light-Emitting Element>

Figure 1:
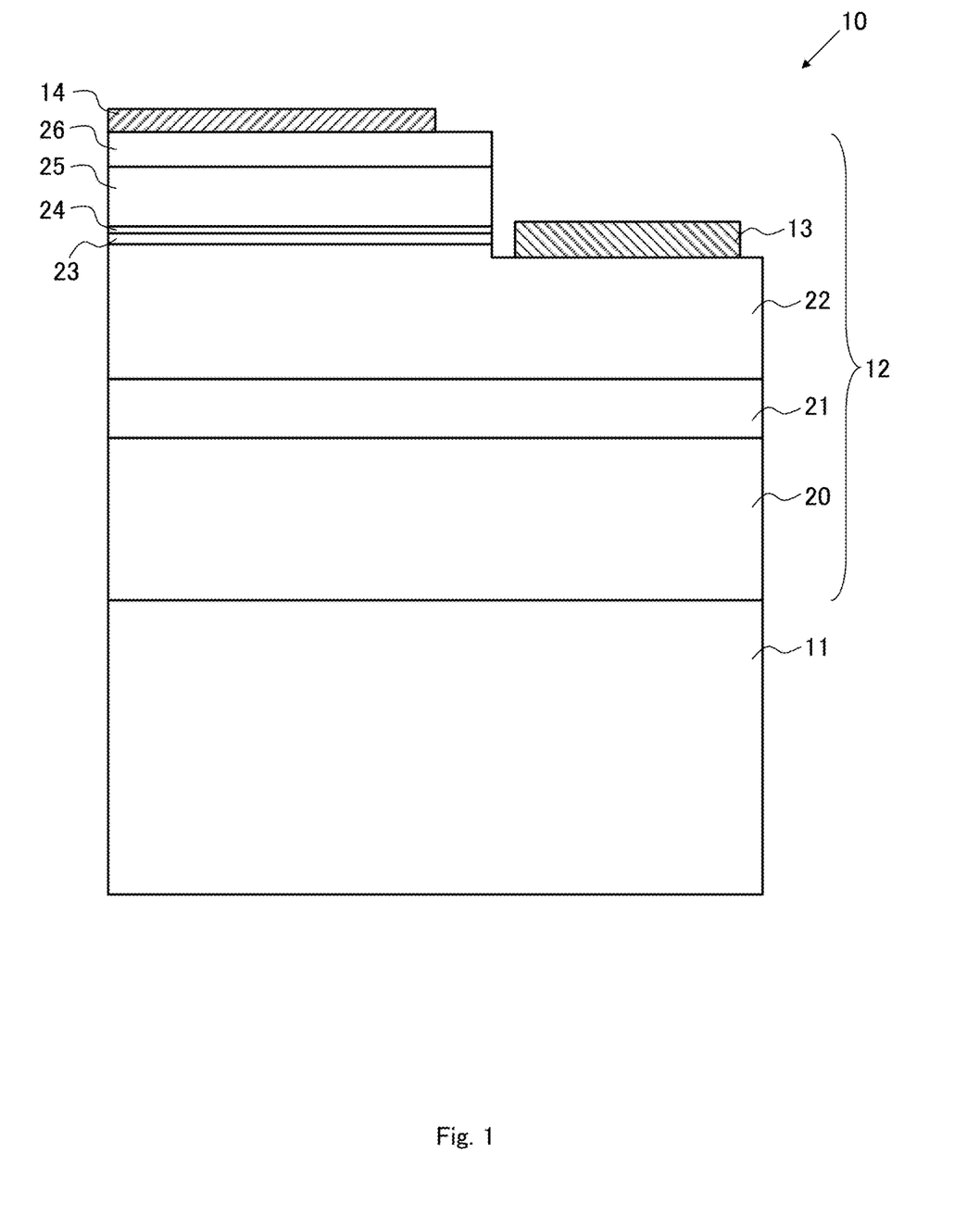
FIG. 1 is a cross-sectional view schematically showing an example of an element structure of a nitride semiconductor light-emitting element included in a light-emitting device according to an embodiment of the present invention.
Figure 2:
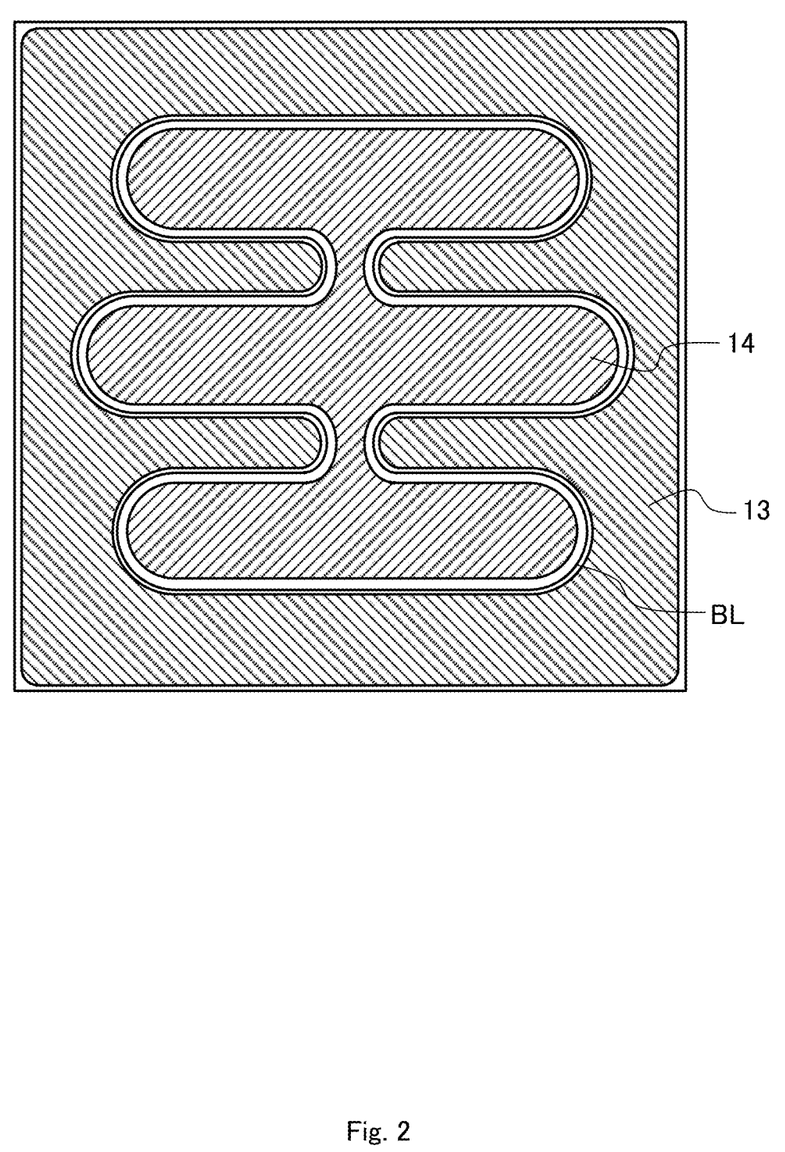
FIG. 2 is a plan view schematically showing a planarly-viewed shape of the nitride semiconductor light-emitting element shown in FIG. 1.

First, an example of a nitride semiconductor light-emitting element included in a light-emitting device according to an embodiment of the present invention will be described with reference to the drawings. FIG. 1 is a cross-sectional view schematically showing an example of an element structure of a nitride semiconductor light-emitting element included in a light-emitting device according to an embodiment of the present invention, and FIG. 2 is a plan view schematically showing a planarly-viewed shape of the nitride semiconductor light-emitting element shown in FIG. 1.

Figure 3:
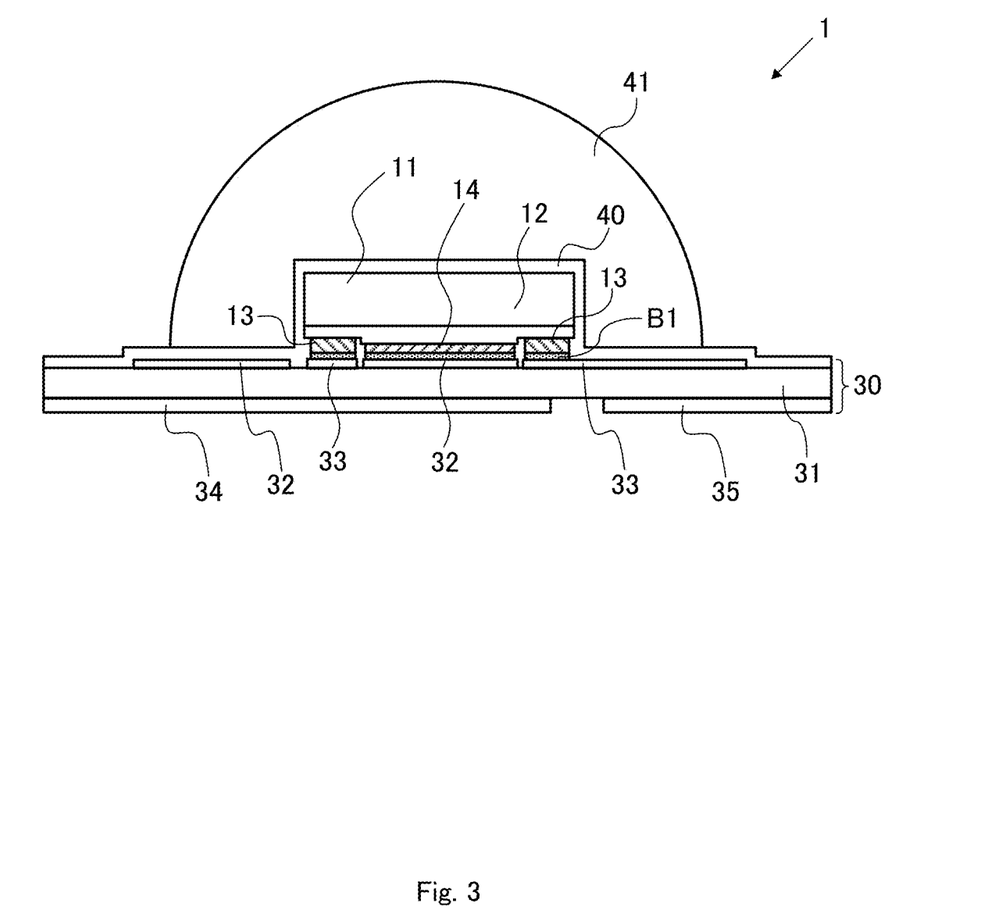
FIG. 3 is a cross-sectional view schematically showing an example of the light-emitting device according to the embodiment of the present invention.

As shown in FIG. 1, a nitride semiconductor light-emitting element 10 included in a light-emitting device according to an embodiment of the present invention includes, on a main surface of a sapphire substrate 11, a semiconductor laminated portion 12 including a plurality of AlGaN based semiconductor layers, an n-electrode 13, and a p-electrode 14. It is assumed in advance that the nitride semiconductor light-emitting element 10 is flip-chip mounted as shown in FIG. 3 described later, and light emitted from the semiconductor laminated portion 12 is taken out to the outside from the rear surface side of the sapphire substrate 11.

For example, the semiconductor laminated portion 12 includes an AlN layer 20, an AlGaN layer 21, an n-type cladding layer 22 made of n-type AlGaN, an active layer 23, a p-type AlGaN electron blocking layer 24, a p-type cladding layer 25 made of p-type AlGaN, and a p-type contact layer 26 made of p-type GaN stacked in order from the sapphire substrate 11. A light emitting diode structure is formed from the n-type cladding layer 22 to the p-type contact layer 26. The sapphire substrate 11, the AlN layer 20, and the AlGaN layer 21 function as a template to form light emitting diode structures thereon. The active layer 23, the electron blocking layer 24, the p-type cladding layer 25, and a part of the p-type contact layer 26 above the n-type cladding layer 22 are removed by reactive ion etching or the like until a part of the surface of the n-type cladding layer 22 is exposed. The semiconductor layers from the active layer 23 to the p-type contact layer 26 above the exposed surface of the n-type cladding layer 22 after the removal are referred to as a "mesa portion" for convenience. The active layer 23 has, for example, a single-layer quantum-well structure composed of an n-type AlGaN barrier layer and a AlGaN or GaN well layer. The active layer 23 may be a double heterojunction structure sandwiched between n-type and p-type AlGaN layers having a large AlN molar fraction in the lower layer and the upper layer, or may be a multiple quantum well structure in which the above single layer quantum well structure is multilayered.

The AlGaN layers are formed by a well-known epitaxial growth method such as a metal-organic vapor phase epitaxy (MOVPE) method or a molecular beam epitaxy (MBE) method, and Si, for example, is used as the donor impurity of the n-type layer, and Mg, for example, is used as the acceptor impurity of the p-type layer.

An n-electrode 13 composed of Ti/Al/Ti/Au, for example, is formed on the exposed surfaces of the n-type cladding layer 22. A p-electrode 14 composed of Ni/Au, for example, is formed on the surfaces of the p-type contact layer 26. Note that the number of layers and materials of the metal layers constituting the n-electrode 13 and the p-electrode 14 are not limited to the number of layers and materials exemplified above.

Further, as shown in FIG. 2, a planarly-viewed chip shape of the nitride semiconductor light-emitting element 10 is square, and the surface of the n-type cladding layer 22 is exposed in the outer peripheral portion of the chip so as to surround the mesa portion of a planarly-viewed comb shape located in the center. Further, a configuration example is assumed in which the n-electrode 13 is formed annularly on the exposed surface of the n-type cladding layer 22 so as to surround the mesa portion, and the p-electrode 14 is formed on top of the mesa portion. In FIG. 2, the hatched portions are the n-electrode 13 and the p-electrode 14, respectively. The boundary line BL between the mesa portion and the exposed surface of the n-type cladding layer 22 is shown for reference.

In the nitride semiconductor light-emitting element 10 of the present embodiment, as shown in FIG. 2, the exposed area of the n-electrode 13 is widened at four corners of the chip, and in flip-chip mounting, a configuration example is assumed in which the n-electrode 13 is physically and electrically coupled with corresponding electrode pads on the submount via bonding materials at the four corners. Note that the planarly-viewed chip shape of the nitride semiconductor light-emitting element 10, the planarly-viewed shape of the mesa portion, the number of n electrodes 13 and p electrodes 14, and the formation position thereof are not limited to the shape, the number, and the formation position illustrated in FIG. 2. In the nitride semiconductor light-emitting element of the present example, the chip size is assumed to be about 0.8 mm to 1.5 mm on one side, but the chip size is not limited to this range.

In the nitride semiconductor light-emitting element 10, the semiconductor laminated portion 12, the n-electrode 13, and the p-electrode 14 formed on the main surface of the sapphire substrate 11 are not limited to the configurations and structures exemplified above, and various known configurations and structures can be employed. In addition, the nitride semiconductor light-emitting element 10 may include components other than the semiconductor laminated portion 12, the n-electrode 13, and the p-electrode 14, for example, a protective film or the like. Therefore, detailed descriptions of the film thicknesses of the AlGaN layers 20 to 26 and the electrodes 13 and 14 are omitted.

As will be described later, the light-emitting device according to the embodiment of the present invention in a configuration that the nitride semiconductor light-emitting element 10 is flip-chip mounted on a base such as a submount and sealed with an amorphous fluororesin, is characterized in that the shape change of the amorphous fluororesin is prevented after the light-emitting device is shipped. Therefore, the semiconductor laminated portion 12, the n-electrode 13, and the p-electrode 14 formed on the main surface of the sapphire substrate 11 are not the gist of the present invention, and since various modifications are conceivable as specific element structures, and can be manufactured by a well-known manufacturing method, a detailed description of the manufacturing method of the nitride semiconductor light-emitting element 10 will be omitted.

<Light-Emitting Device>

Figure 4A:
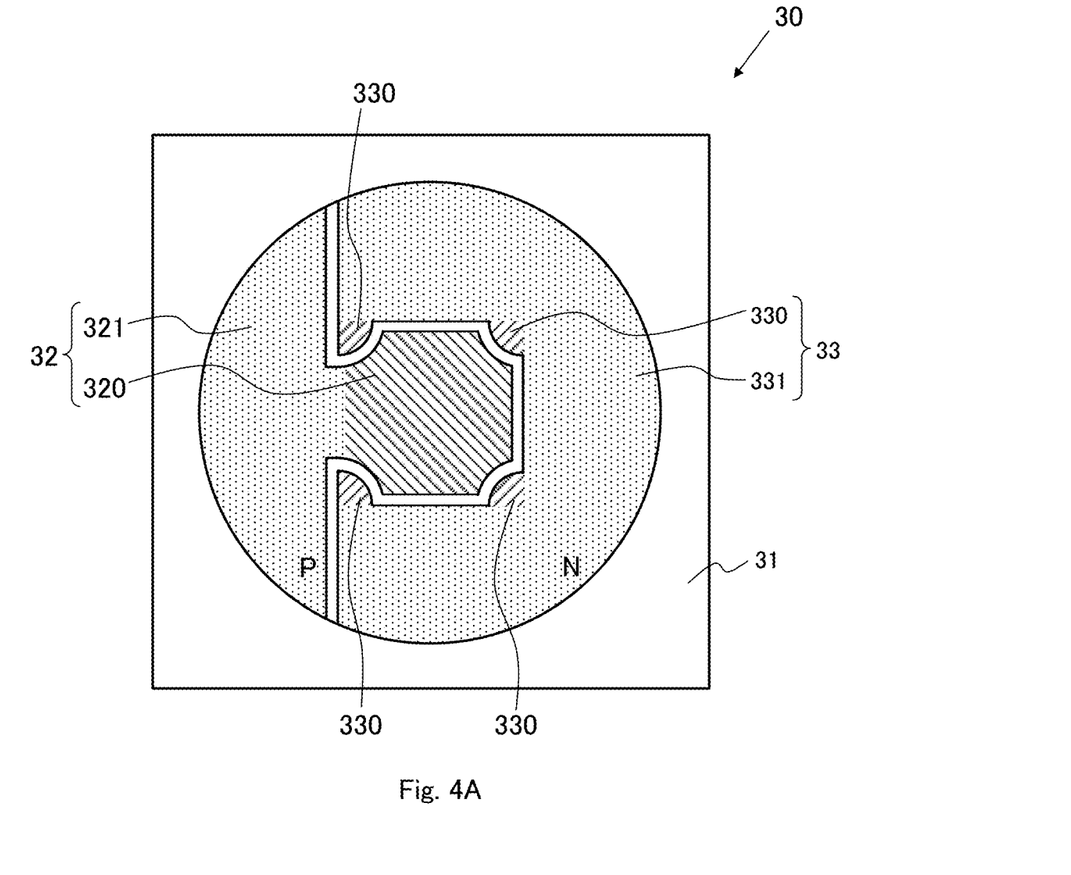
FIGS. 4A and 4B are a plan view and a cross-sectional view schematically showing a planarly-viewed shape and a cross-sectional shape of a submount used in the light-emitting device shown in FIG. 3.
Figure 4B:
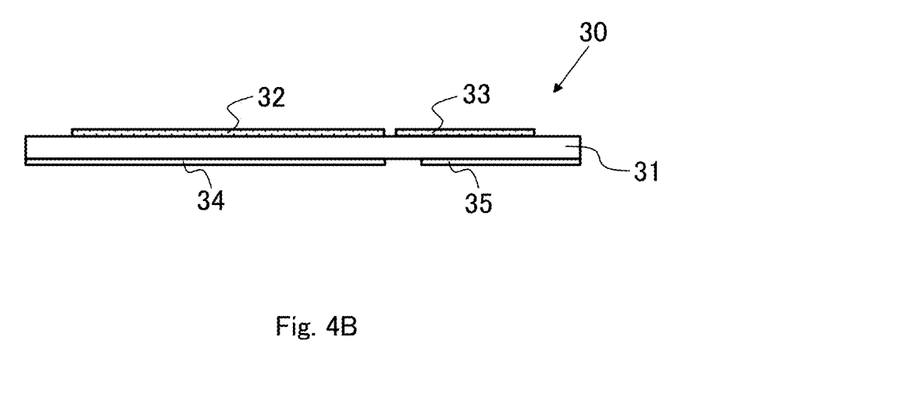

Next, a light-emitting device according to an embodiment of the present invention will be described with reference to FIGS. 3, 4A and 4B. FIG. 3 is a cross-sectional view schematically showing an example of the light-emitting device according to the embodiment of the present invention. FIGS. 4A and 4B are a plan view and a cross-sectional view schematically showing a planarly-viewed shape and a cross-sectional shape of a submount used in the light-emitting device shown in FIG. 3.

As shown in FIG. 3, the nitride semiconductor light-emitting element 10 is mounted (flip-chip mounted) on a submount 30 with the main surface side of the sapphire substrate 11 facing the submount 30. In the following description with reference to FIG. 3, the direction of the nitride semiconductor light-emitting element 10 side is defined as the upward direction with reference to the mounting surface of the submount 30.

FIG. 4A is a plan view showing the planarly-viewed shape of the submount 30, and FIG. 4B is a cross-sectional view showing the cross-sectional shape in a cross section perpendicular to the surface of the submount 30 passing through the center of the submount 30 in the plan view FIG. 4A. The length of one side of the submount 30 is not limited to a specific value as long as the nitride semiconductor light-emitting element 10 can be mounted and the sealing resin can be formed around it. As an example, the length of one side of the submount 30 having a planarly-viewed square shape is preferably, for example, about 1.5 to 2 times or more of the chip size (length of one side) of the nitride semiconductor light-emitting element 10 to be mounted in the same planarly-viewed square shape. It should be noted that the planarly-viewed shape of the submount 30 is not limited to a square.

The submount 30 includes a flat base material 31 made of an insulating material such as insulating ceramics, and the first metal electrode wiring 32 on the anode side and the second metal electrode wiring 33 on the cathode side are respectively formed on the front surface of the base material 31, and lead terminals 34 and 35 are formed on the rear surface of the base material 31. The first and second metallic electrode wirings 32 and 33 on the front surface of the base material 31 are respectively connected to the lead terminals 34 and 35 on the rear surface of the base material 31 via through electrodes (not shown) provided through the base material 31. When the submount 30 is mounted on another wiring board or the like, an electrical connection is formed between the metallic wiring on the wiring board and the lead terminals 34 and 35. The lead terminals 34 and 35 cover substantially the entire rear surface of the base material 31, and fulfill the functionality of a heat sink.

As shown in FIGS. 4A and 4B, the first and second metal electrode wirings 32 and 33 are formed at and around a place where the nitride semiconductor light-emitting element 10 is mounted in the central portion of the base material 31, and are arranged apart from each other and electrically separated from each other. The first metallic electrode wiring 32 includes first electrode pads 320 and first wiring portions 321 connected thereto. The second metallic electrode wiring 33 is composed of four second electrode pads 330 and a second wiring portion 331 connected thereto. The first electrode pad 320 has a planarly-viewed shape slightly larger than the outer frame of the comb-shaped planarly-viewed shape of the p-electrode 14 of the nitride semiconductor light-emitting element 10 (the outer circumference of the shape in which the mesa portion is also assumed to be present in the concave portion of the comb shape), and is located at the center of the central portion of the base material 31. The planarly-viewed shape, the number, and the arrangement of the second electrode pads 330 are set so that, when the nitride semiconductor light-emitting element 10 is arranged so that the p-electrode 14 of the nitride semiconductor light-emitting element 10 faces the first electrode pad 320, widened portions of the exposed area of the n-electrode 13 at the four corners face the second electrode pads 330, respectively. In FIG. 4A, the first electrode pad 320 and the second electrode pads 330 are hatched, respectively. Note that the planarly-viewed shape of the first and second metal electrode wirings 32 and 33 is not limited to the shape shown in FIG. 4A, and various modifications of the planarly-viewed shape are possible as long as the p-electrode 14 faces the first electrode pad 320 and the four corners of the n-electrode 13 face the second electrode pad 330.

The substrate 31 of the submount 30 is formed of an insulating material such as aluminum nitride (AlN) that does not deteriorate due to exposure to ultraviolet rays. Although AlN is preferable in terms of heat dissipation, the base material 31 may be silicon carbide (SiC), silicon nitride (SiN), boron nitride (BN), or a ceramic such as alumina ($Al_2O$) or the like. The base material 31 is not limited to the solid material of the insulating material, and may be a sintered body in which silica glass is used as a binder and particles of the insulating material are closely bonded, or may be a diamond-like carbon (DLC) thin film, an industrial diamond thin film, or the like.

In the case where the submount 30 does not have the lead terminals 34 and 35 on the rear surface of the base material 31, the base material 31 may have a laminated structure of a metal film (e.g., Cu, Al, or the like) and an insulating layer made of the above-mentioned insulating material, instead of being formed of an insulating material alone.

As an example, the first and second metal electrode wirings 32 and 33 are composed of a thick-film plated film of copper and a single or multilayer surface metal film covering the surface, i.e., the upper surface and the side wall surface, of the thick-film plated film. The outermost layer of the surface metal film is composed of a metal (for example, gold (Au) or a platinum group metal (Ru, Rh, Pd, Os, Ir, Pt, or an alloy of two or more of these) or an alloy of gold and a platinum group metal) which has a smaller ionization tendency than copper constituting the thick film plating film.

As shown in FIG. 3, the nitride semiconductor light-emitting element 10 is placed on and fixed to the central part of the base material 31 with the n-electrode 13 and the p-electrode 14 facing downward, as the p-electrode 14 and the first electrode pad 320, and the four corners of the n-electrode 13 and the four second electrode pads 330 are respectively facing each other and electrically and physically connected with each other via a bonding material B1 such as AuSn solder or gold bumps. When the bonding material B1 is composed of a solder material such as AuSn solder, the top surfaces of the p-electrode 14 and the n-electrode 13 (the bottom surfaces in FIG. 3) may be formed to be in the same plane with aligned heights, and the p-electrode 14 and the first metal electrode wiring 32, and the n-electrode 13 and the second metal electrode wiring 33 may be physically and electrically connected by a well-known soldering method such as solder reflow. Further, as a method of aligning the heights so that the top surfaces of the p-electrode 14 and the n-electrode 13 are in the same plane, for example, a method of forming a p-side plating electrode electrically connected the p-electrode 14 so as to cover the top surface (the bottom surface in FIG. 3) and the side surface of the mesa portion via an insulating protective film, and forming an n-side plating electrode which is separated from the p-side plating electrode and electrically connected to the n-electrode 13 at the same height as the p-side plating electrode by an electrolytic plating method or the like can be considered. For details of the plating electrode, reference is made to the specification of WO 2016/157518 and the like.

Further, as shown in FIG. 3, the nitride semiconductor light-emitting element 10 mounted on the submount 30 is sealed by a sealing resin 40. Specifically, the upper surface and the side surface of the nitride semiconductor light-emitting element 10 and the upper surface of the submount 30 (the upper surface and the side surface of the first and second metal electrode wirings 32 and 33 and the surface of the base material 31 exposed between the first and second metal electrode wirings 32 and 33) are covered with the sealing resin 40, and the sealing resin 40 is filled in the gap between the submount 30 and the nitride semiconductor light-emitting element 10. Further, the upper surface of the sealing resin 40 is covered with the same fluororesin lens 41 as the sealing resin 40. The lens 41 has an optical lens shape that focuses or diffuses at least the light emitted from the nitride semiconductor light-emitting element 10, and the shape is appropriately designed according to the purpose of the light-emitting device 1.

The sealing resin 40 and the lens 41 are made of an amorphous fluororesin having excellent heat resistance, ultraviolet ray resistance, and ultraviolet ray transmittance. Amorphous fluororesin includes an amorphized polymer alloy obtained by copolymerizing a fluororesin of a crystalline polymer, a copolymer of perfluorodioxole (trade name of Teflon AF (registered trademark) manufactured by DuPont) and a cyclized polymer of perfluoro butenyl vinyl ether (trade name of Cytop (registered trademark) manufactured by AGC Inc.).

Amorphous fluororesins are roughly classified into a bonding amorphous fluororesin having a reactive terminal functional group exhibiting a metal-bonding property and a non-bonding amorphous fluororesin having no reactive terminal functional group. The reactive terminal functional group is, by way of example, a carboxyl group (COOH) or an ester group (COOR). Where R represents an alkyl group.

The sealing resin 40 formed around the electrode is preferably formed of the non-bonding amorphous fluororesin not having the reactive terminal functional group which can cause migration of the metal constituting the electrode, because short-circuiting due to the migration can be prevented. For example, it is preferable to configure the sealing resin 40 by using a non-bonding amorphous fluororesin in which a structural unit constituting a polymer or copolymer has a fluorine-containing aliphatic cyclic structure and a terminal functional group is a perfluoroalkyl group such as $CF_3$ which exhibits non-bonding property to metals or the like. In addition, the lens 41 may be formed of any amorphous fluororesin having a bonding property and a non-bonding property, but in the light-emitting device 1 according to the embodiment of the present invention, the lens 41 is formed of a non-bonding amorphous fluororesin like the sealing resin 40.

Preferable as a structural unit having a fluorine-containing aliphatic cyclic structure is a unit based on a cyclic fluorine-containing monomer (hereinafter referred to as "unit A") or a unit formed by cyclopolymerization of diene fluorine-containing monomers (hereinafter referred to as "unit B"). It should be noted that the composition and structure of the amorphous fluororesin are not the subject matter of the present invention, and therefore a detailed description of the unit A and the unit B is omitted, but the unit A and the unit B are described in detail in paragraphs [0031] to [0058] of WO 2014/178288 by the same applicant as the present application, and therefore, reference is made thereto.

As the cyclic polymerization method, homopolymerization method, and copolymerization method of the monomer, for example, a known method disclosed in Japanese Patent Laid-Open No. 4-189880 or the like can be applied. Amorphous fluororesin having a desired weight average molecular weight is obtained by methods such as adjusting the concentration of the monomer, adjusting the concentration of the initiator, and adding an additive transfer agent at the time of polymerization (cyclization polymerization, homopolymerization, copolymerization) of the monomer. In the following description, the weight average molecular weight of the polymer or copolymer constituting the amorphous fluororesin is simply described as the weight average molecular weight of the amorphous fluororesin.

Further, there is a possibility that the above-mentioned reactive terminal functional group or other unstable functional group is formed in the terminal functional group of the amorphous fluororesin after the polymerization treatment. Therefore, when a non-bonding amorphous fluororesin having a $CF_3$ terminal functional group is obtained, for example, a fluorine gas is contacted with the amorphous fluororesin after the polymerizing treatment by using a known method disclosed in Japanese Patent Laid-Open No. 11-152310 or the like, whereby the reactive terminal functional group or the unstable terminal functional group is replaced with $CF_3$ which is a non-reactive terminal functional group.

As an example of a commercial product of the non-bonding amorphous fluororesin, there is cited Cytop (manufactured by AGC Inc.). The cytop in which the terminal functional group is $CF_3$ is a polymer of the above-mentioned units B represented by the following formula 1.

[Formula 1]

<Manufacturing Method of Light-Emitting Device>

Next, a method of manufacturing a light-emitting device according to an embodiment of the present invention will be described.

First, the bare chip of the diced nitride semiconductor light-emitting element 10 is fixed on the first and second metal electrode wirings 32 and 33 of the submount 30 by known flip-chip mounting. Specifically, the p-electrode 14 and the first metal electrode wiring 32 are physically and electrically connected via the bonding material B1 such as AuSn solder or gold bumps, and the n-electrode 13 and the second metal electrode wiring 33 are physically and electrically connected via the bonding material B1 (step 1).

Subsequently, a coating liquid in which the non-bonding amorphous fluororesin is dissolved in a fluorine-containing solvent, preferably an aprotic fluorine-containing solvent, is prepared (step 2).

Subsequently, the coating liquid prepared in Step 2 is injected onto the submount 30 and the nitride semiconductor light-emitting element 10 using a Teflon needle or the like having good peelability, and then the solvent is evaporated while gradually heating the coating solution to form a sealing resin 40, which is a non-bonding amorphous fluororesin, in the upper surface and the side surfaces of the nitride semiconductor light-emitting element 10, the upper surface and the side surfaces of the submount 30 (the upper surface and the side surfaces of the first and second metal electrode wirings 32, 33, the surface of the base material 31 exposed between the first and second metal electrode wirings 32, 33), and the gap between the submount 30 and the nitride semiconductor light-emitting element 10 (Step 3). In the evaporation of the solvent in Step 3, the solvent is evaporated by gradually heating from a low temperature range (for example, near room temperature) equal to or lower than the boiling point of the solvent to a high temperature range (for example, near 200° C.) equal to or higher than the boiling point of the solvent so that no bubbles remain in the sealing resin 40.

Subsequently, the sealing resin 40 is softened by heating in a temperature range of, for example, 150° C. to 300° C., more preferably 200° C. to 300° C., which is lower than or equal to a temperature (about 350° C.) at which decomposition of the non-bonding amorphous fluororesin starts, and the sealing resin 40 on the upper surface of the nitride semiconductor light-emitting element 10 is pressed toward the nitride semiconductor light-emitting element 10 side (step 4).

Subsequently, a lens 41 made of an amorphous fluororesin having the same nonbonding property as that of the sealing resin 40 is formed on the sealing resin 40 by a well-known molding method such as injection molding, transfer molding, compression molding, or the like so as to cover the nitride semiconductor light-emitting element 10 (step 5). The mold for each molding may be a metal mold, a silicone resin mold, or a combination thereof.

It should be noted that the heating and pressing process in the step 4 may be performed at the same time as the formation of the lens 41 in the step 5. Alternatively, only the heat treatment may be performed in the step 4, and the pressing treatment may be performed at the time of forming the lens 41 in the step 5. Further, when the bonding material B1 is formed of a solder material such as AuSn solder, it is preferable to set the temperatures in steps 3 to 5 so as not to exceed the melting point of the bonding material B1 (about 280° C. for AuSn solder), because the connection between the nitride semiconductor light-emitting element 10 and the submount 30 can be prevented from being damaged due to melting of the bonding material B1.

<Utilization of Light-Emitting Device by User>

Figure 5:
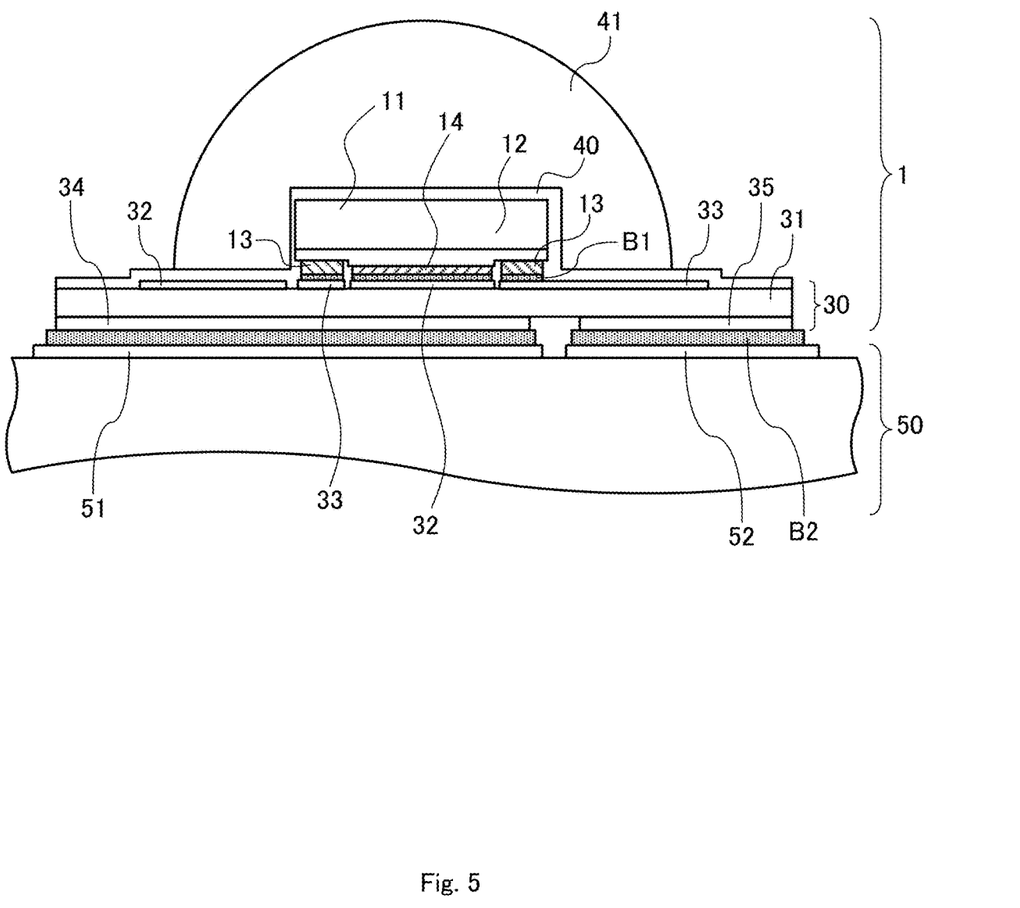
FIG. 5 is a cross-sectional view schematically showing an example of a implementation device on which a light-emitting device according to an embodiment of the present invention is mounted.

Next, a usage mode of the light-emitting device 1 according to the embodiment of the present invention by the user will be described with reference to the drawings. FIG. 5 is a cross-sectional view schematically showing an example of a implementation device on which a light-emitting device according to an embodiment of the present invention is mounted.

As shown in FIG. 5, the user mounts the light-emitting device 1 on a desired implementation device 50, for example, an ultraviolet sterilization device. For example, the lands 51 in the implementation device 50 and the lead terminals 34 in the light-emitting device 1 are physically and electrically connected via the bonding materials B2 such as SnAgCu solder, and the lands 52 in the implementation device 50 and the lead terminals 35 in the light-emitting device 1 are physically and electrically connected, so that the light-emitting device 1 is mounted on the implementation device 50.

The light-emitting device 1 is mounted on the implementation device 50 by, for example, a solder reflow process. The solder reflow process is, for example, a process of heating the light-emitting device 1 and the implementation device 50 while mounting the light-emitting device 1 on the implementation device 50 such that the lead terminal 34 is positioned on the land 51 on the surface of which the bonding material B2 such as SnAgCu solder is formed, and the lead terminal 35 is positioned on the land 52 on the surface of which the bonding material B2 is formed. More specifically, in a reflow furnace having a predetermined temperature profile, the light-emitting device 1 and the implementation device 50 are heated by moving the implementation device 50 on which the light-emitting device 1 is mounted using a moving device such as a belt conveyor.

Figure 6:
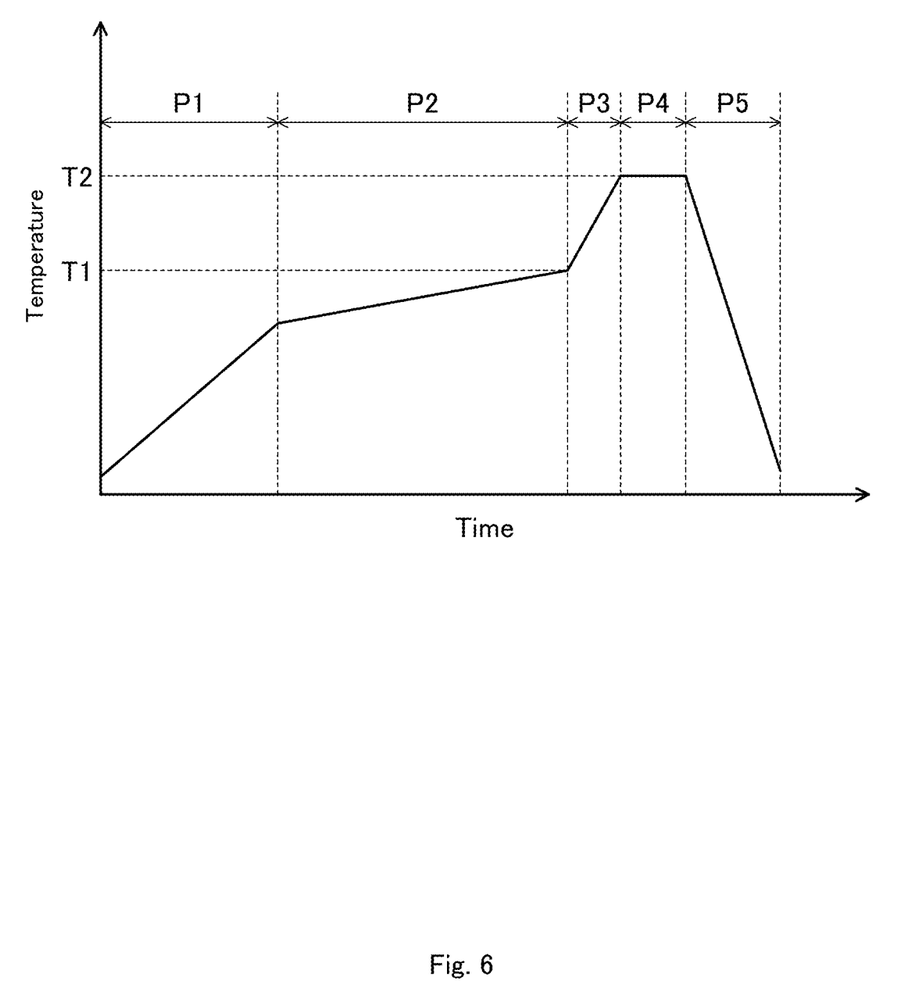
FIG. 6 is a diagram showing an example of a temperature profile in the solder reflow process.

Here, the temperature profile in the solder reflow process will be described by way of example. FIG. 6 is a diagram showing an example of a temperature profile in the solder reflow process. The temperature shown in FIG. 6 is a temperature in the vicinity of the bonding material B2 (for example, in the vicinity of the mounting surface of the implementation device 50). The temperature profile shown in FIG. 6 is set by the manufacturer of the light-emitting device 1, for example, in order to prevent the light-emitting device 1 from being damaged by heat.

The temperature profile illustrated in FIG. 6 is divided into periods P1 to P5. The periods P1 to P3 are temperature increasing periods, the period P4 is a period for maintaining the temperature T2 which is the maximum temperature, and the period P5 is a temperature decreasing period. However, the temperature rising gradient in the period P2 is slower than the temperature rising gradient in each of the periods P1 and P3, and the temperature T1 at the end of the period P2 is equal to or lower than the melting point of the bonding material B2. The temperature T2 is not less than the melting point of the bonding material B2.

For example, when the bonding material B2 is a common solder and is a SnAgCu solder having a melting point of 220° C., the temperature T1 is set to approximately 200° C. and the temperature T2 is set to approximately 260° C.

However, the temperature of 260° C. is a temperature at which the amorphous fluororesin can be softened to cause a shape change. Further, not only the solder reflow process but also a heat treatment at a temperature at which a shape change of the amorphous fluororesin may occur may be desired by the user. When heat treatment is performed on the light-emitting device 1 at such a temperature, the shape of the amorphous fluororesin constituting the sealing resin 40 and the lens 41 is changed, so that the performance of the light-emitting device 1 may be impaired. In particular, if the shape of the lens 41, whose optical characteristics are affected by the shape, changes, the light emitting performance of the light-emitting device 1 may be greatly impaired.

Therefore, the light-emitting device 1 according to the embodiment of the present invention is shipped in a form that allows heat treatment at a temperature at which a shape change of the amorphous fluororesin can occur, as described below. Thus, the user can perform heat treatment at a temperature at which the shape of the amorphous fluororesin can be changed.

<Shipment Form of Light-Emitting Device>

Figure 7:
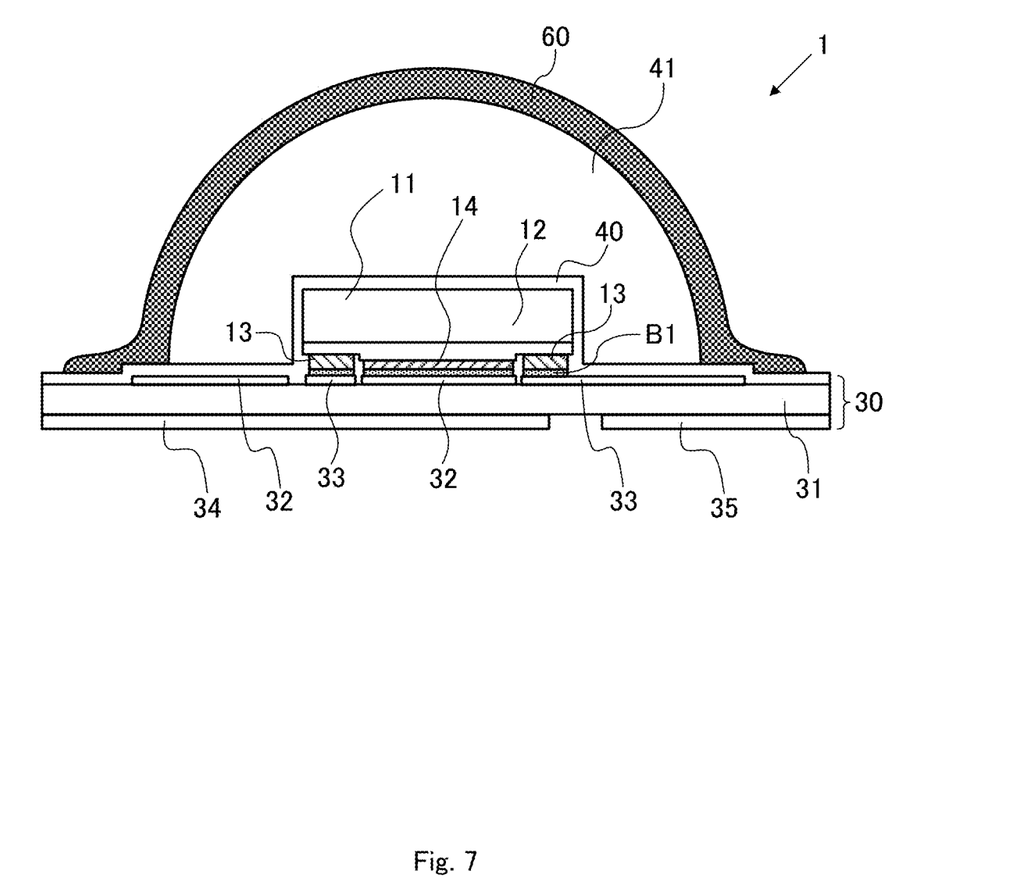
FIG. 7 is a cross-sectional view schematically showing an example of the light-emitting device in a shipment form according to the embodiment of the present invention.

A shipment form of the light-emitting device 1 capable of heat treatment at a temperature at which a shape change of an amorphous fluororesin can occur will be described with reference to the drawings. FIG. 7 is a cross-sectional view schematically showing an example the light-emitting device in a shipment form according to the embodiment of the present invention.

As shown in FIG. 7, the light-emitting device 1 at the time of shipment is provided with a deformation-prevention layer 60 for preventing the shape change of the amorphous fluororesin due to the heat treatment after the shipment. The deformation-prevention layer 60 is formed to directly cover the surface of the amorphous fluororesin. For example, the shape change preventing layer 60 is formed so as to directly cover at least the surface of the optical lens shape of the exposed surface of the amorphous fluororesin. Specifically, for example, the deformation-prevention layer 60 is formed so as to cover the entire surface of the lens 41 and the surface of the sealing resin 40 corresponding to the peripheral portion of the lens 41.

The deformation-prevention layer 60 is formed of a material which is stable at least at the lower limit temperature at which the shape change of the amorphous fluororesin occurs, for example, a material which is hard to undergo the shape change and decomposition. For example, the deformation-prevention layer 60 is formed of a material that is stable at 260° C. Specifically, it is preferable that the deformation-prevention layer 60 is formed of a layer in which a thermosetting resin or an ultraviolet curing resin (including an ultraviolet curing resin that is cured by ultraviolet rays at a temperature higher than normal temperature), which is a resin hardly softened by heat, is cured. For example, it is preferable that the deformation-prevention layer 60 is formed of a layer obtained by curing a silicone resin or an epoxy resin.

The deformation-prevention layer 60 is formed by molding the above-mentioned resin material on the surface of the amorphous fluororesin by a well-known molding method such as injection molding, transfer molding, compression molding, or the like. As the mold for each molding, a metal mold, a resin mold having a low affinity (easy release) with the resin material constituting the deformation-prevention layer 60, or the like can be used. However, it is preferable that the temperature at which the deformation-prevention layer 60 is molded is lower than the lower limit temperature at which the shape change of the amorphous fluororesin occurs.

The deformation-prevention layer 60 is removed by the user by a physical method such as peeling using tweezers, needles, or the like, a chemical method such as dissolving in a solvent, or both of these methods after a process that involves a heat treatment such as a solder reflow process for mounting the light-emitting device 1 on the implementation device 50 is completed. When it is assumed that the deformation-prevention layer 60 is removed by a physical method, it is preferable to form the deformation-prevention layer 60 using a material having a low affinity for the amorphous fluororesin to the extent that it can be peeled off from the amorphous fluororesin.

As described above, in the light-emitting device 1, the surface of the amorphous fluororesin is directly covered with the deformation-prevention layer 60 composed of a layer in which a thermosetting resin or an ultraviolet curing resin, which is a resin hardly softened by heat, is cured, thereby preventing the shape change of the amorphous fluororesin by the heat treatment after shipment. Therefore, the light-emitting device 1 can be subjected to heat treatment at a temperature at which the shape of the amorphous fluororesin can be changed after shipment.

In particular, as shown in FIG. 7, by providing the deformation-prevention layer 60 so as to cover at least the surface of the lens 41 (the portion of the optical lens shape), it is possible to prevent the shape change of the lens 41 whose optical characteristics are affected by the shape, thereby preventing the light emitting performance of the light-emitting device 1 from being greatly impaired.

While the deformation-prevention layer 60 may be formed by molding a resin material on the surface of the amorphous fluororesin as described above, a cap-shaped deformation-prevention layer that is separately produced so as to fit to the outer shape of the lens 41 may be used as the deformation-prevention layer 60 by covering the lens 41, or a mold (e.g., a silicone resin mold) used at the time of molding the lens 41 and left without being removed after molding the lens 41 may be used as the deformation-prevention layer 60.

In FIG. 7, the deformation-prevention layer 60 is formed so as to cover the entire surface of the lens 41 and the surface of the exposed portion of the sealing resin 40 corresponding to the peripheral portion of the lens 41, but the deformation-prevention layer may be formed so as to cover the entire surface of the exposed surface of the amorphous fluororesin (the entire surface of each exposed surface of the lens 41 and the sealing resin 40, including the side surface of the sealing resin 40 in the vicinity of the end portion of the submount 30). In this case, not only the shape change of the lens 41 but also the shape change of the sealing resin 40 can be prevented.

Figure 8:
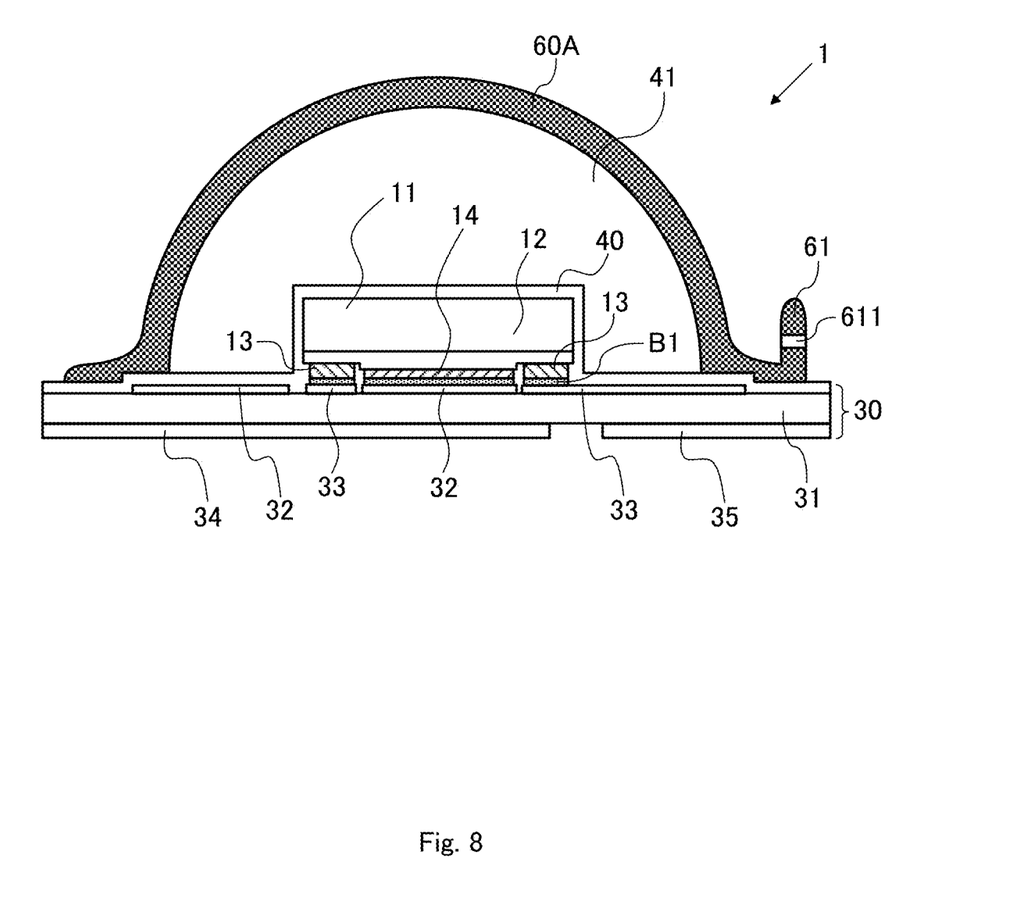
FIG. 8 is a cross-sectional view schematically showing another example of the light-emitting device in a shipment form according to the embodiment of the present invention.

Further, when it is assumed that the user removes the deformation-prevention layer 60 by a physical method, a handle portion for facilitating removal of the deformation-prevention layer 60 may be provided in the deformation-prevention layer 60. Here, an example of a light-emitting device including a deformation-prevention layer having a handle portion will be described with reference to the drawings. FIG. 8 is a cross-sectional view schematically showing another example of the light-emitting device in a shipment form according to the embodiment of the present invention.

As shown in FIG. 8, the deformation-prevention layer 60A is provided with a handle portion 61 protruding to facilitate gripping the deformation-prevention layer 60A. Particularly, the handle portion 61 is provided with a through hole 611 for inserting and gripping an elongated jig such as a tip of tweezers or a needle thereinto. It should be noted that the shape of the handle portion 61 illustrated in FIG. 8 is merely an example, and any shape may be used as long as it facilitates gripping of the deformation-prevention layer 60A. For example, the handle portion 61 may have a shape without the through hole 611. In FIG. 8, the case where the handle portion 61 is provided in the peripheral portion of the deformation-prevention layer 60A is illustrated, but may be provided in the vicinity of the top of the lens 41, for example.

<Modifications, Etc.>

[1] When the amorphous fluororesin constituting the sealing resin 40 or the lens 41 sufficiently adsorbs oxygen, nitrogen, or water vapor due to exposure of the light-emitting device 1 to the atmosphere for a long time, the oxygen, nitrogen, or water vapor adsorbed by the amorphous fluororesin may expand and the amorphous fluororesin may foam during heat treatment by the user after shipment.

In order to prevent such foaming, it is preferable that the light-emitting device 1 is shipped in a package in which the amorphous fluororesin hardly adsorbs oxygen, nitrogen, and water vapor. For example, it is preferable that the light-emitting device 1 is shipped by being enclosed in an airtight package in which the inside is decompressed from the atmospheric pressure, an airtight package in which helium gas or argon gas is filled, or an airtight package in which helium gas or argon gas is filled and the inside is decompressed from atmospheric pressure. The airtight package is formed of, for example, a sheet in which aluminum is vapor-deposited on a resin material, such as polyethylene or polypropylene.

By shipping the light-emitting device 1 sealed in the hermetic package as described above, oxygen, nitrogen, and water vapor adsorbed by the amorphous fluororesin can be reduced more than a case by sufficiently exposing the light-emitting device 1 to the atmosphere, when the user breaks the hermetic package and takes out the light-emitting device 1 to perform heat treatment. For example, the amount of oxygen, nitrogen, and water vapor adsorbed by the amorphous fluororesin at the time of heat treatment of the light-emitting device 1 by the user can be made smaller than the maximum amount that can be adsorbed by the amorphous fluororesin when the light-emitting device 1 is exposed to the atmosphere, preferably ½ or less, more preferably ⅓ or less of the maximum amount. In addition, for example, the amount of oxygen, nitrogen, and water vapor adsorbed by the amorphous fluororesin when the user performs heat treatment on the light-emitting device 1 can be made smaller than the amount of helium gas or argon gas adsorbed by the amorphous fluororesin.

Note that, as a shipment form of the light-emitting device 1, only an airtight package for preventing foaming of an amorphous fluororesin is adopted, and the above-described deformation-prevention layer 60 may not be provided.

In addition, after the deformation-prevention layer 60 is provided, the above-described hermetic package may be adopted. In this case, the following is preferable. If the deformation-prevention layer 60 has gas permeability to helium, argon, oxygen, nitrogen, and water vapor, problems such as dropout of the deformation-prevention layer 60 and deformation of the amorphous fluororesin due to trapping of gas between the deformation-prevention layer 60 and the amorphous fluororesin can be avoided.

In addition, the above-mentioned foaming of the amorphous fluororesin can also be suppressed by degassing before heat treatment at a high temperature at which foaming occurs. As the degassing treatment, for example, a vacuum degassing treatment at 120° C. for 2 hours, or a treatment in which the temperature rising gradient of the period P2 in the solder reflow step shown in FIG. 6 is made extremely gradual at 10° C./hour or the like can be used. However, these treatments have a problem that a long time is required in order to prevent deformation or foaming of the amorphous fluororesin.

However, the light-emitting device 1 provided with the deformation-prevention layer 60 can prevent deformation of the amorphous fluororesin even when exposed to a certain high temperature. Therefore, in the case of the light-emitting device 1, the degree of freedom of setting conditions in the degassing process can be increased by, for example, increasing the temperature of the vacuum degassing process to be higher than 120° C. and shortening the processing time to be shorter than 2 hours accordingly. Further, in this case, it is preferable that the deformation-prevention layer 60 has gas permeability to oxygen, nitrogen, and water vapor, because problems such as dropout of the deformation-prevention layer 60 and deformation of the amorphous fluororesin due to trapping of gas between the deformation-prevention layer 60 and the amorphous fluororesin during the vacuum degassing process can be avoided.

[2] Regardless of the bonding property or non-bonding property, the higher the weight average molecular weight is, the higher the melt viscosity becomes, and when the melt viscosity becomes larger than about 100,000 Pa·s, the fluidity is lost and the shape change does not occur in the amorphous fluororesin. Here, assuming that the maximum value of the heat treatment temperature after shipment is 260° C., it can be said that if the weight average molecular weight is larger than 700000, the shape change of the amorphous fluororesin does not occur at 260° C. (the melt viscosity becomes larger than 100000 Pa·s) since the melt viscosity ratio of the resin is proportional to the 3.4th power of the molecular weight ratio (3.4th power rule of viscosity) and the melt viscosity of the amorphous fluororesin having a weight average molecular weight of 250000 at 260° C. is approximately 3000 Pa·s.

Therefore, when the weight average molecular weight is 700000 or less, the above-described deformation-prevention layer 60 can exert its effect. Further, when the melt viscosity is so high that the shape change of the amorphous fluororesin does not occur at 260° C., the molding temperature must be increased in order to secure the fluidity of the amorphous fluororesin at the time of molding, but when the bonding material B1 is composed of a solder material such as AuSn solder, the molding temperature exceeds the melting point of the bonding material B1 (approximately 280° C. for AuSn solder), and thus the connection between the nitride semiconductor light-emitting element 10 and the submount 30 may be impaired. For these reasons, the weight average molecular weight of the amorphous fluororesin is preferably 700,000 or less.

In the case of using an amorphous fluororesin having a weight average molecular weight as small as about 150000, the risk of the shape of the amorphous fluororesin being changed by the heat treatment by the user is extremely high, but this risk can be avoided by providing the deformation-prevention layer 60. That is, in the case of providing the deformation-prevention layer 60, it is possible to use an amorphous fluororesin having a weight average molecular weight of 150000 or more. Further, it is also possible to use an amorphous fluororesin having a weight average molecular weight smaller than 150000 to the extent that there is no problem in molding the sealing resin 40 or the lens 41.

Note that the weight average molecular weight of the amorphous fluororesin constituting each of the sealing resin 40 and the lens 41 may be the same or different. In addition, although it is extremely difficult to estimate the molecular weight of the amorphous fluororesin, the weight-average molecular weight can be estimated by, for example, conversion based on melt viscosity or unique viscosity.

[3] In the above embodiment, it is assumed that the user removes the deformation-prevention layer 60 after the heat treatment, but the removal of the deformation-prevention layer 60 may be made unnecessary. For example, in the case where the deformation-prevention layer 60 is formed of a material and a shape which hardly adversely affect the operation of the light-emitting device 1, the removal of the deformation-prevention layer 60 may be unnecessary.

[4] Although the light-emitting device 1 in which one nitride semiconductor light-emitting element 10 is mounted on the submount 30 has been described in the above embodiment, the light-emitting device 1 may be configured by mounting a plurality of nitride semiconductor light-emitting elements 10 on a base such as a submount or a printed circuit board. In this case, the plurality of nitride semiconductor light-emitting devices 10 may be sealed together with the sealing resin 40, or may be individually sealed one by one. In this instance, for example, a resin dam surrounding the periphery of the one or more nitride semiconductor light-emitting element 10 in units of sealing is formed on the surface of the base, and the sealing resin 40 is formed in the area surrounded by the resin dam, for example, in the manner described in the above embodiment. Like the sealing resin 40, the lens 41 may also be collectively formed for a plurality of nitride semiconductor light-emitting elements 10, or may be individually formed one by one. Further, the deformation-prevention layer 60 may be formed collectively with respect to the plurality of nitride semiconductor light-emitting elements 10 and the amorphous fluororesin, or may be formed individually one by one. Note that the base on which the nitride semiconductor light-emitting element 10 is mounted is not limited to a submount and a printed circuit board.

Also in the case where one nitride semiconductor light-emitting element 10 is mounted on the submount 30, the light-emitting device 1 may be manufactured by forming the first and second metal electrode wirings 32 and 33 of the plurality of submounts 30 on the front surface side of one substrate 31, forming the lead terminals 34 and 35 of the plurality of submounts 30 on the rear surface side of one substrate 31, flip-chip mounting the plurality of nitride semiconductor light-emitting elements 10 on the respective submounts 30 which are arranged on a submount plate in matrix, respectively, forming the sealing resin 40 or the sealing resin 40 and the lens 41 for the plurality of nitride semiconductor light-emitting elements 10, and then dividing the submount plate into individual submounts 30, thereby mounting one nitride semiconductor light-emitting element 10 on the submount 30. Further, in this case, after the deformation-prevention layer 60 is formed on each of the plurality of nitride semiconductor light-emitting elements 10 and the amorphous fluororesin, the submount plate may be divided into individual submounts 30.

INDUSTRIAL APPLICABILITY

The light-emitting device according to the present invention can be used for a light-emitting device including a nitride semiconductor light-emitting element flip-chip mounted on a base, and in particular, can be used for a light-emitting device including a nitride semiconductor light-emitting element that emits light having an emission center wavelength of 365 nm or less (ultraviolet light).

DESCRIPTION OF SYMBOLS

1: Light-emitting device
10: Nitride semiconductor light-emitting element
11: Sapphire substrate
12: Semiconductor laminated portion
13: n-electrode
14: p-electrode
20: AlN layer
21: AlGaN layer
22: n-type clad layer (n-type AlGaN)
23: Active layer
24: Electron blocking layer (p-type AlGaN)

25: p-type clad layer (p-type AlGaN)
26: p-type contact layer (p-type GaN)
30: Submount (base)
31: Substrate
32: First metal electrode wiring
320: First electrode pad
321: First wiring part
33: Second metal electrode wiring
330: Second electrode pad
331: Second wiring part
34, 35: Lead terminal
40: Sealing resin
41: Lens
50: Implementation device
51, 52: Land
60: Deformation-prevention layer
60A: Deformation-prevention layer
61: Handle portion
B1: Bonding material
B2: Bonding material
T1-T5: Period

The invention claimed is:

1. A light-emitting device comprising:
a base;
a nitride semiconductor light-emitting element flip-chip mounted on the base; and
an amorphous fluororesin sealing the nitride semiconductor light-emitting element,
wherein the light-emitting device comprises a deformation-prevention layer for preventing a shape change of the amorphous fluororesin by heat treatment after shipment of the light-emitting device,
wherein the deformation-prevention layer comprises a layer in which a thermosetting resin or an ultraviolet curing resin is cured,
wherein the cured layer directly covers a surface of the amorphous fluororesin, and
wherein the light-emitting device in a shipment form is enclosed in an airtight package in which an inside is decompressed, in an airtight package in which an inside is filled with helium gas or argon gas, or in an airtight package in which an inside is decompressed and filled with helium gas or argon gas.

2. The light-emitting device according to claim 1, wherein the deformation-prevention layer covers at least a surface of an optical lens shape that focuses or diffuses light emitted from the nitride semiconductor light-emitting element, out of an exposed surface of the amorphous fluororesin.

3. The light-emitting device according to claim 1, wherein the deformation-prevention layer is made of a silicone resin or an epoxy resin.

4. The light-emitting device according to claim 1, wherein the deformation-prevention layer has gas permeability to helium, argon, oxygen, nitrogen, and water vapor.

5. The light-emitting device according to claim 1, wherein a structural unit of a polymer or a copolymer constituting the amorphous fluororesin has a fluorine-containing aliphatic cyclic structure.

6. The light-emitting device according to claim 1, wherein a terminal functional group of a polymer or a copolymer constituting the amorphous fluororesin is a perfluoroalkyl group.

7. The light-emitting device according to claim 1, wherein the nitride semiconductor light-emitting element is an ultraviolet light-emitting element having a light emission center wavelength in a range of 200 nm or more and about 365 nm or less.

8. The light-emitting device according to claim 1, wherein a weight average molecular weight of a polymer or a copolymer constituting the amorphous fluororesin is 700,000 or less.

9. A light-emitting device comprising:
a base;
a nitride semiconductor light-emitting element flip-chip mounted on the base; and
an amorphous fluororesin sealing the nitride semiconductor light-emitting element,
wherein the light-emitting device comprises a deformation-prevention layer for preventing a shape change of the amorphous fluororesin by heat treatment after shipment of the light-emitting device,
wherein the deformation-prevention layer comprises a layer in which a thermosetting resin or an ultraviolet curing resin is cured,
wherein the cured layer directly covers a surface of the amorphous fluororesin, and
wherein the light-emitting device in a shipment form is enclosed in an airtight package in which an inside is decompressed.

10. The light-emitting device of claim 9, wherein the light-emitting device in the shipment form is enclosed in the airtight package in which the inside is decompressed and filled with helium gas or argon gas.

11. The light-emitting device according to claim 9, wherein
the deformation-prevention layer covers at least a surface of an optical lens shape that focuses or diffuses light emitted from the nitride semiconductor light-emitting element, out of an exposed surface of the amorphous fluororesin.

12. The light-emitting device according to claim 9, wherein
the deformation-prevention layer is made of a silicone resin or an epoxy resin.

13. The light-emitting device according to claim 9, wherein
the deformation-prevention layer has gas permeability to helium, argon, oxygen, nitrogen, and water vapor.

14. The light-emitting device according to claim 9, wherein
a structural unit of a polymer or a copolymer constituting the amorphous fluororesin has a fluorine-containing aliphatic cyclic structure.

15. The light-emitting device according to claim 9, wherein
a terminal functional group of a polymer or a copolymer constituting the amorphous fluororesin is a perfluoroalkyl group.

16. The light-emitting device according to claim 9, wherein
the nitride semiconductor light-emitting element is an ultraviolet light-emitting element having a light emission center wavelength in a range of 200 nm or more and about 365 nm or less.

17. The light-emitting device according to claim 9, wherein
a weight average molecular weight of a polymer or a copolymer constituting the amorphous fluororesin is 700,000 or less.

18. A light-emitting device comprising:
a base;
a nitride semiconductor light-emitting element flip-chip mounted on the base; and
an amorphous fluororesin sealing the nitride semiconductor light-emitting element,
wherein the light-emitting device comprises a deformation-prevention layer for preventing a shape change of the amorphous fluororesin by heat treatment after shipment of the light-emitting device,
wherein the deformation-prevention layer comprises a layer in which a thermosetting resin or an ultraviolet curing resin is cured,
wherein the cured layer directly covers a surface of the amorphous fluororesin, and
wherein the light-emitting device in a shipment form is enclosed in an airtight package in which an inside is filled with helium gas or argon gas.

19. The light-emitting device according to claim 18, wherein
the deformation-prevention layer covers at least a surface of an optical lens shape that focuses or diffuses light emitted from the nitride semiconductor light-emitting element, out of an exposed surface of the amorphous fluororesin.

20. The light-emitting device according to claim 18, wherein:
the deformation-prevention layer is made of a silicone resin or an epoxy resin; and
the deformation-prevention layer has gas permeability to helium, argon, oxygen, nitrogen, and water vapor.

* * * * *